(12) United States Patent
Korikawa

(10) Patent No.: US 8,608,258 B2
(45) Date of Patent: Dec. 17, 2013

(54) CABINET RACK AND RACK MOUNT HOLDER

(75) Inventor: Masayuki Korikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 105 days.

(21) Appl. No.: 13/023,350

(22) Filed: Feb. 8, 2011

(65) Prior Publication Data

US 2011/0221314 A1    Sep. 15, 2011

(30) Foreign Application Priority Data

Mar. 9, 2010  (JP) ................................ 2010-051897

(51) Int. Cl.
*A47B 81/00* (2006.01)

(52) U.S. Cl.
USPC ................ 312/223.1; 312/265.1; 361/724

(58) Field of Classification Search
USPC .......... 312/265.1, 265.2, 265.3, 265.4, 257.1, 312/334.1, 334.4, 351, 223.1; 211/26, 189, 211/190, 191, 192, 151, 126.15, 175; 361/724–727; 248/235, 243, 244, 248/223.41, 221.11, 222.13
See application file for complete search history.

(56) References Cited

U.S. PATENT DOCUMENTS

| | | | | |
|---|---|---|---|---|
| 4,955,743 A * | 9/1990 | King | ............................. | 403/254 |
| 5,025,937 A * | 6/1991 | King | ............................. | 211/192 |
| 5,240,213 A * | 8/1993 | Horcher | ................... | 248/223.41 |
| 6,373,695 B1 * | 4/2002 | Cheng | ..................... | 361/679.39 |
| 6,382,436 B1 * | 5/2002 | Wang | ............................ | 211/207 |
| 6,591,997 B2 * | 7/2003 | Hung | ............................ | 211/183 |
| 6,926,378 B2 * | 8/2005 | Greenwald et al. | ........ | 312/334.4 |
| 7,226,025 B2 * | 6/2007 | Sato et al. | ..................... | 248/200 |
| 7,284,672 B2 * | 10/2007 | Tsai | ............... | 211/208 |
| 7,301,756 B2 * | 11/2007 | Wayman | ................. | 361/679.01 |
| 8,235,339 B2 * | 8/2012 | Selvidge et al. | ......... | 248/220.21 |
| 2002/0131242 A1 * | 9/2002 | Nagasawa | ..................... | 361/727 |
| 2003/0071002 A1 * | 4/2003 | Hung | ............................ | 211/183 |
| 2004/0094492 A1 * | 5/2004 | Greenwald et al. | ............. | 211/26 |
| 2005/0189855 A1 * | 9/2005 | Naue et al. | .................. | 312/334.4 |
| 2009/0114785 A1 * | 5/2009 | Huang et al. | ............. | 248/220.31 |
| 2009/0309471 A1 * | 12/2009 | Yu et al. | .................... | 312/334.44 |

FOREIGN PATENT DOCUMENTS

| | | |
|---|---|---|
| JP | 8-19972 A | 1/1996 |
| JP | 2002-232169 A | 8/2002 |

* cited by examiner

*Primary Examiner* — Darnell Jayne
*Assistant Examiner* — Hiwot Tefera
(74) *Attorney, Agent, or Firm* — Fujitsu Patent Center

(57) ABSTRACT

A cabinet rack for housing a piece of electronic equipment secured to a mounting member, the cabinet rack includes a plurality of vertically extending support posts; a first supporting member secured to one of the support posts, the first supporting member including a guide vertically extending along the one of the support posts, the guide with the one of the support posts forming a guide groove therebetween; a second supporting member including a fixing portion for fixing the mounting member, and a slider portion provided in the guide groove so as to slide along the guide to a mounting position in the cabinet rack; and a third supporting member including a pressing portion provided between the slider portion and the one of the support posts to secure the second supporting member to the first supporting member by pressing the slider portion against the guide.

8 Claims, 13 Drawing Sheets

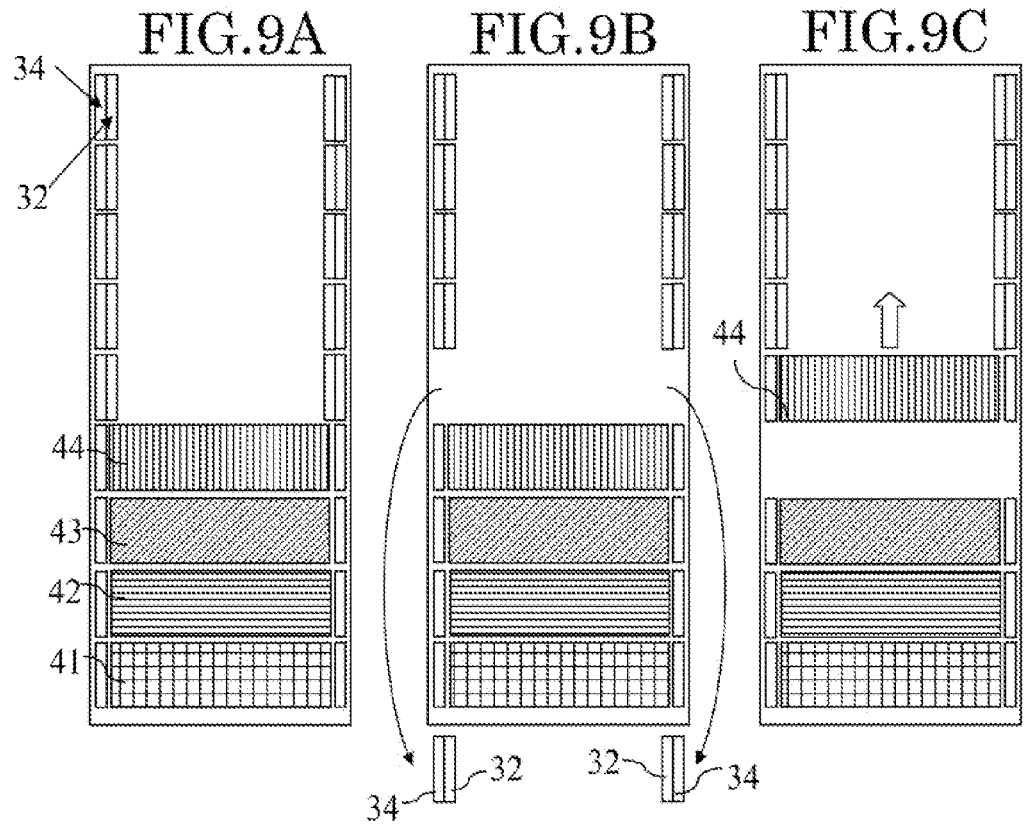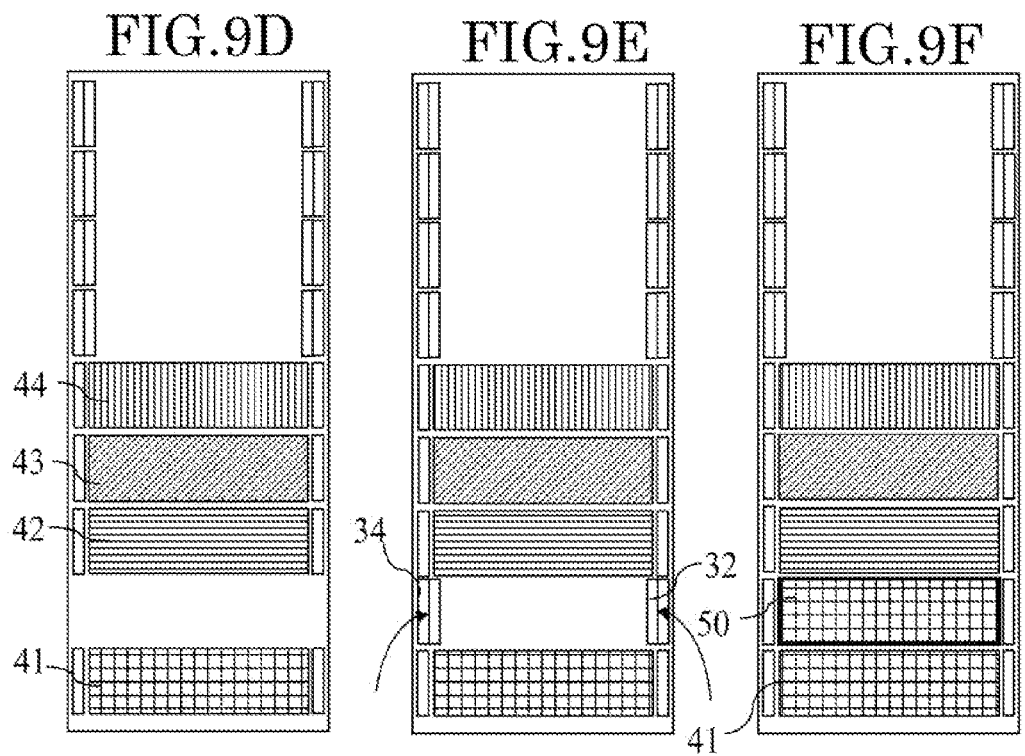

Related Art

Related Art

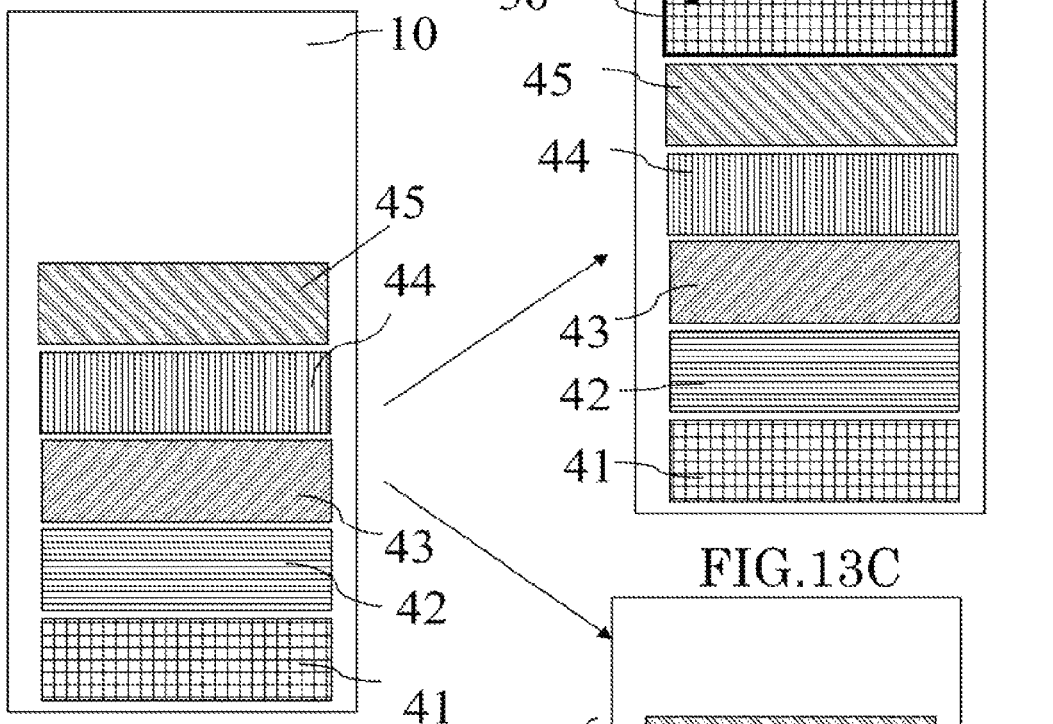
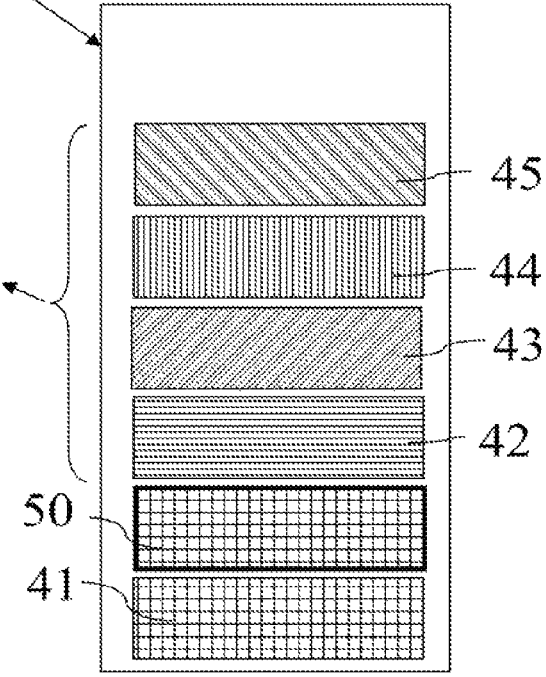
Related Art

CABINET RACK AND RACK MOUNT HOLDER

CROSS-REFERENCE TO RELATED APPLICATION

This application is based upon and claims the benefit of priority of the prior Japanese Patent Application No. 2010-51897, filed on Mar. 9, 2010, the entire contents of which are incorporated herein by reference.

FIELD

The embodiments discussed herein are related to a cabinet racks in which electronic equipment such as communication equipment and a storage device is mounted and relates to a rack mount holder used to mount such electronic equipment.

BACKGROUND

When installing electronic equipment such as communication equipment and a storage device, cabinet racks that house the equipment stacked flat therein are used.

In such cabinet racks, the 19-inch racks, each of which is made to have a 19-inch width in compliant with the Electronic Industries Alliance (EIA) standard, have become a standard (referred to as the "standard rack" hereinafter). A height standard is set to a mounting unit (1 U) of electronic equipment, that is, 44.45 mm.

A variety of electronic equipment is designed in sizes that are in compliant with the standard in order to be mounted in the standard racks. A single rack houses a combination of variety of types of electronic equipment.

In particular, after a system is upgraded, sometimes additional pieces of electronic equipment are mounted in the racks because of an increase in the amount of data to be handled or expansion of business operations. Additional mounting of electronic equipment in the racks often takes time and efforts since such work is manually performed. In order to deal with a combination of different types of electronic equipment, L-shaped mounting supports are used to mount the electronic equipment.

FIG. 10 is a schematic diagram illustrating an interior of a rack 10 seen from the front side, indicating a front view of the rack 10 having a rectangular parallelepiped shape. FIG. 11 illustrates an operation in which a piece of electronic equipment is mounted. The rack 10 includes a top plate 8, a base plate 7 that constitute part of a casing, and a total of four vertically extending rack support posts 11, two of which are disposed at the front side and the other two of which are disposed at the back side.

Each of the rack posts 11 is provided with a vertically extending equipment mount support post 13 therealong. The equipment mount support posts 13 have fixing holes 13h (tapped holes) therein for mounting pieces of electronic equipment 1. The fixing holes are arranged at predetermined intervals in accordance with the mounting unit.

As illustrated in FIG. 11, the piece of electronic equipment 1 is inserted from the front side of the rack 10, and is mounted on mounting surfaces 12l of L-shaped mounting supports 12.

FIG. 12 illustrates the rack post 11 and a portion therearound at the front side of the rack 10 seen in the −Z direction in FIG. 11. The piece of electronic equipment 1 is mounted on the mounting surfaces 12l of the L-shaped mounting supports 12. Each equipment mount support post 13 is provided with two fixing portions 13t and 13s, which are disposed perpendicularly to each other so as to form an L-shape. A fixing portion 11t of the rack post 11 and the fixing portion 13t of the equipment mount support post 13 are superposed with each other so as to cause the corresponding tapped holes to oppose each other, and are secured with a screw 4.

Each fixing portions it of the piece of electronic equipment 1, the fixing portion 13s of the corresponding equipment mount support post 13, and the fixing portion 12t that extends from the mounting surface 12l of the corresponding mounting support 12 are superposed with each other so as to cause the corresponding tapped holes to oppose each other, and are fastened with a screw 5.

FIGS. 13A to 13C illustrate a way to mount an additional piece of electronic equipment to the rack 10. A case will be described below, where an additional piece of electronic equipment 50 is mounted inside the casing of the rack 10 as an expansion of a piece of electronic equipment 41 after a system is upgraded. Referring to FIG. 13A, in a preliminary stage (step 1), the pieces of electronic equipment 41 to 45 are generally stacked in order from the bottom to the top in the rack 10 without providing empty spaces therebetween as illustrated in order to prevent the rack 10 from falling. The pieces of electronic equipment 41 to 45 are different from each other.

As illustrated in FIG. 13B, in step 2a, an empty space at an upper area of the rack 10 is utilized for mounting the additional piece of electronic equipment 50 above the piece of electronic equipment 45 positioned at the topmost location among the existing pieces of electronic equipment 41 to 45. Additional mounting work is easy when such an empty space or a separate rack is used as in the above example.

However, when it is attempted to connect the additional piece of electronic equipment 50 to the existing piece of electronic equipment 41 in such additional mounting, such an attempt may fail in some cases because of an insufficient length of a standard cable.

In addition, maintenance tools are separately provided for each of the pieces of electronic equipment 41 to 45 in order to maintain these pieces of electronic equipment. Such a maintenance tool may indicate status of a corresponding piece of electronic equipment on a display in accordance with a layout of the piece of electronic equipment. In the present example, the additional piece of electronic equipment 50 appears to be mounted immediately above the piece of electronic equipment 41 in the screen display of the maintenance tool for the piece of electronic equipment 41.

However, as described above, the other pieces of electronic equipment 42 to 45 are mounted between the piece of electronic equipment 41 and the additional piece of electronic equipment 50 in the actual rack 10. Thus, layout of the screen differs from the actual layout of the equipment. This makes maintenance management complicated.

Therefore, it is preferable to install the additional piece of electronic equipment 50 close to the existing piece of electronic equipment 41. To achieve such a configuration, operations of the existing pieces of electronic equipment are stopped, and out of the existing electronic equipment, the pieces of electronic equipment 42 to 45 are temporarily moved out of the rack 10 in order to allocate a space for additional mounting. After that, as illustrated in FIG. 13C, in step 2b, the additional piece of electronic equipment 50 is mounted above the piece of electronic equipment 41, and the other pieces of electronic equipment 42 to 45 are mounted in order above the additional piece of electronic equipment 50.

As described above, there is a step in which existing electronic equipment is temporarily moved out of a rack and connection cables and mounting supports are removed in order to change the order of the pieces of electronic equipment mounted in the rack. This means that additional mounting work takes considerable time. Furthermore, since operations of the existing electronic equipment is stopped when it is moved out of the rack, additional mounting is performed in a period of time in which business operations are not affected. Therefore, there has been a problem in that it is difficult to efficiently perform additional mounting work at a convenient time.

The following is a reference document.

[Patent Document 1] Japanese Laid-open Patent Publication No. 08-019972

SUMMARY

According to an aspect of the embodiment, a cabinet rack for housing a piece of electronic equipment secured to a mounting member, the cabinet rack includes a plurality of vertically extending support posts; a first supporting member secured to one of the support posts, the first supporting member including a guide vertically extending along the one of the support posts, the guide with the one of the support posts forming a guide groove therebetween; a second supporting member including a fixing portion for fixing the mounting member, and a slider portion provided in the guide groove so as to slide along the guide to a mounting position in the cabinet rack; and a third supporting member including a pressing portion provided between the slider portion and the one of the support posts to secure the second supporting member to the first supporting member by pressing the slider portion against the guide.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 9A to 9F illustrate a way to mount additional electronic equipment to the rack.

FIGS. 13A to 13C illustrate a way to mount an additional piece of electronic equipment to the rack.

DESCRIPTION OF EMBODIMENTS

Preferred embodiments of the present techniques will be explained with reference to accompanying drawings.

Figure 1:
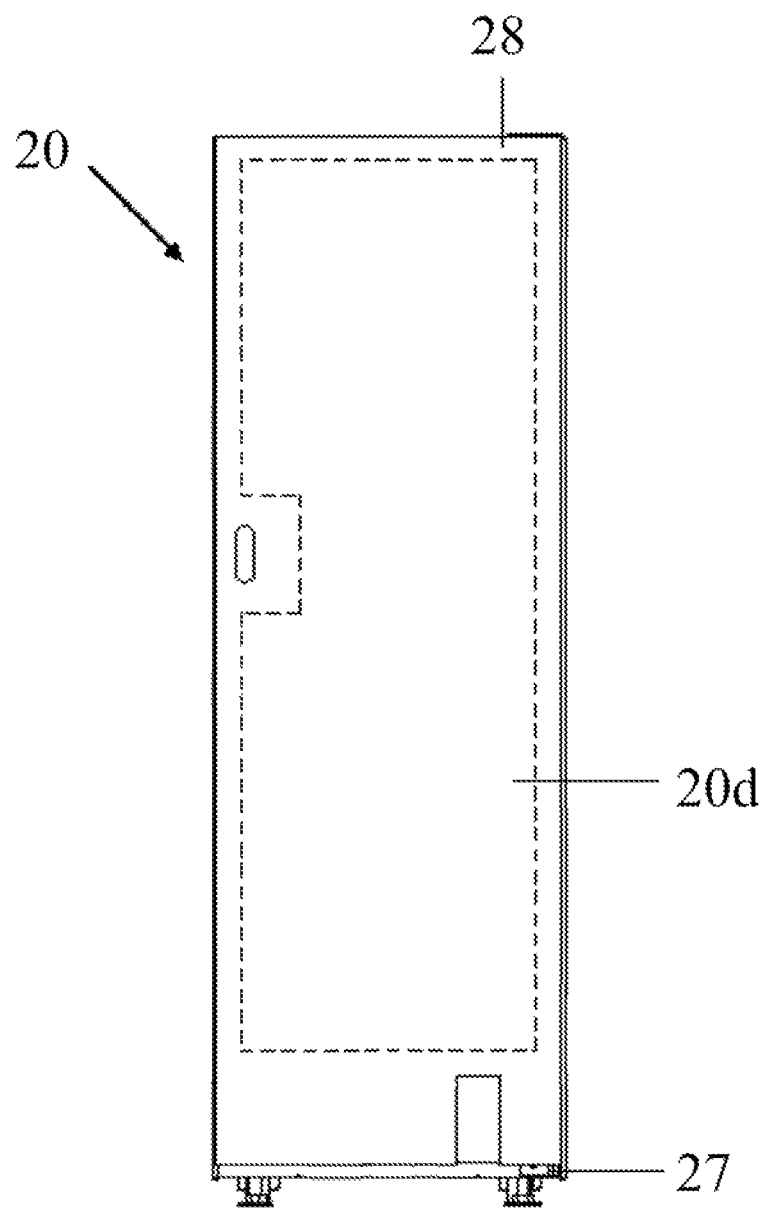
FIG. 1 is an external view of a cabinet rack.
Figure 2:
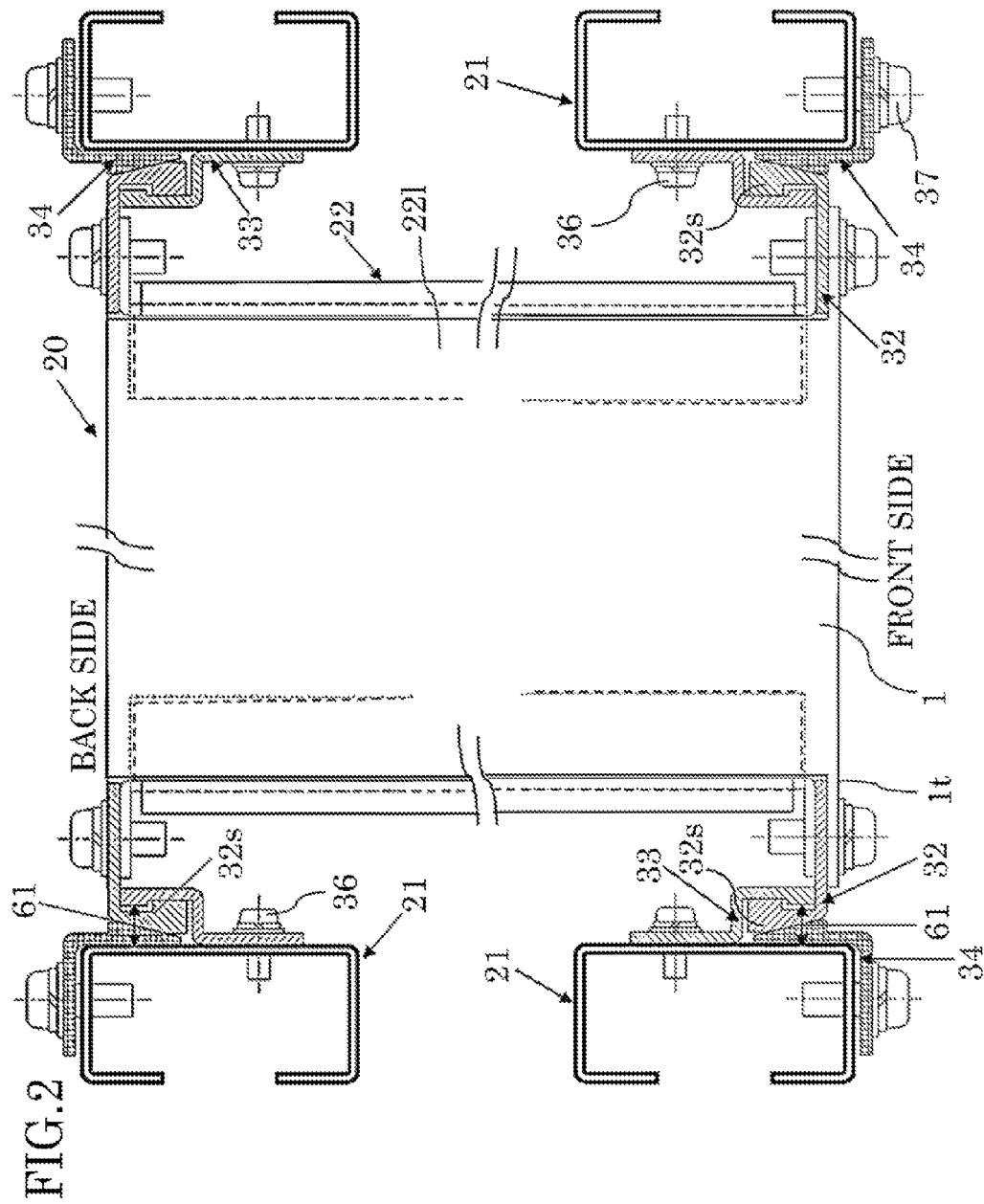
FIG. 2 is a schematic diagram illustrating a mounting structure of the cabinet rack.

A cabinet rack and a rack-mount holder for mounting electronic equipment according to an embodiment will be described with reference to FIGS. 1 to 8D. FIG. 1 is an external view of the cabinet rack. FIG. 2 is a schematic diagram illustrating a mounting structure of the cabinet rack.

Referring to FIG. 1, a rack 20 includes a top plate 28, a base plate 27, and a door 20d as covering members. FIG. 2 illustrates a top view of an internal structure of the rack 20. A casing is provided with a total of four vertically extending rack support posts 21, two of which are disposed at a front side and the other two of which are disposed at a back side.

For each rack support post 21, an equipment mount support post 33 is provided. The equipment mount support posts 33 extend in a direction parallel to the vertical direction of the corresponding rack support posts 21, that is, a top-bottom direction of the casing. In detail, a tapped hole of a fixing portion 21t of each rack support post 21 opposes a tapped hole 33h of the fixing portion 33t of the corresponding equipment mount support post 33. A screw 36 is inserted through these tapped holes.

It is preferable that the rack support posts 21 and the equipment mount support posts 33 be formed of a stiff material so as to support the weight of a plurality of pieces of equipment. In the present embodiment, metal such as stainless steel or aluminum is used. The length of each equipment mount support post 33 is substantially equal to the height of the interior of the casing in order to allow a piece of electronic equipment 1 to be movable from the top to the bottom inside the casing.

The piece of electronic equipment 1 is inserted into the rack 20 from the front side and is mounted on mounting surfaces 22l of L-shaped mounting supports 22. Ordinarily, the mounting supports 22 come with electronic equipment thereon.

Figure 3:
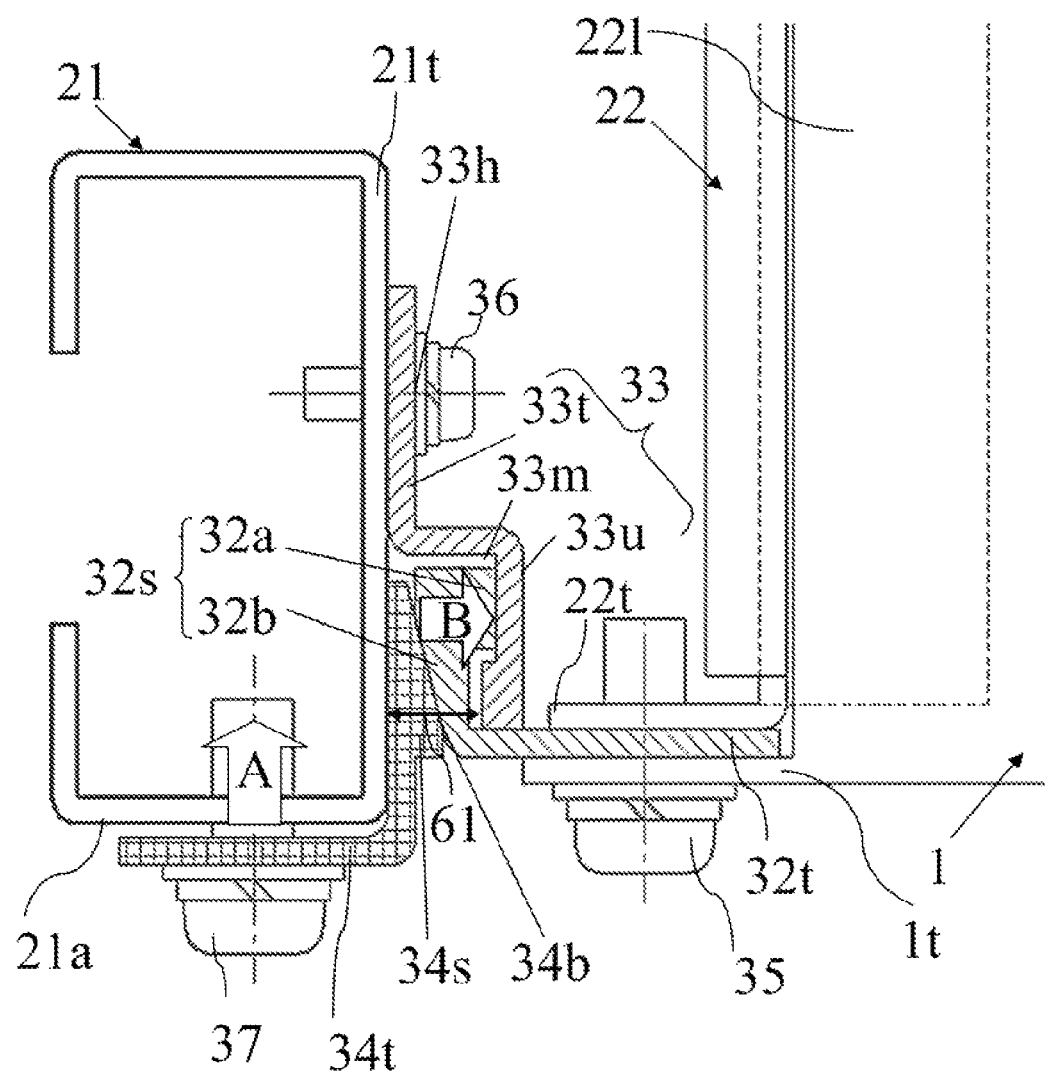
FIG. 3 is an enlarged diagram illustrating part of the structure illustrated in FIG. 2.
Figure 4:
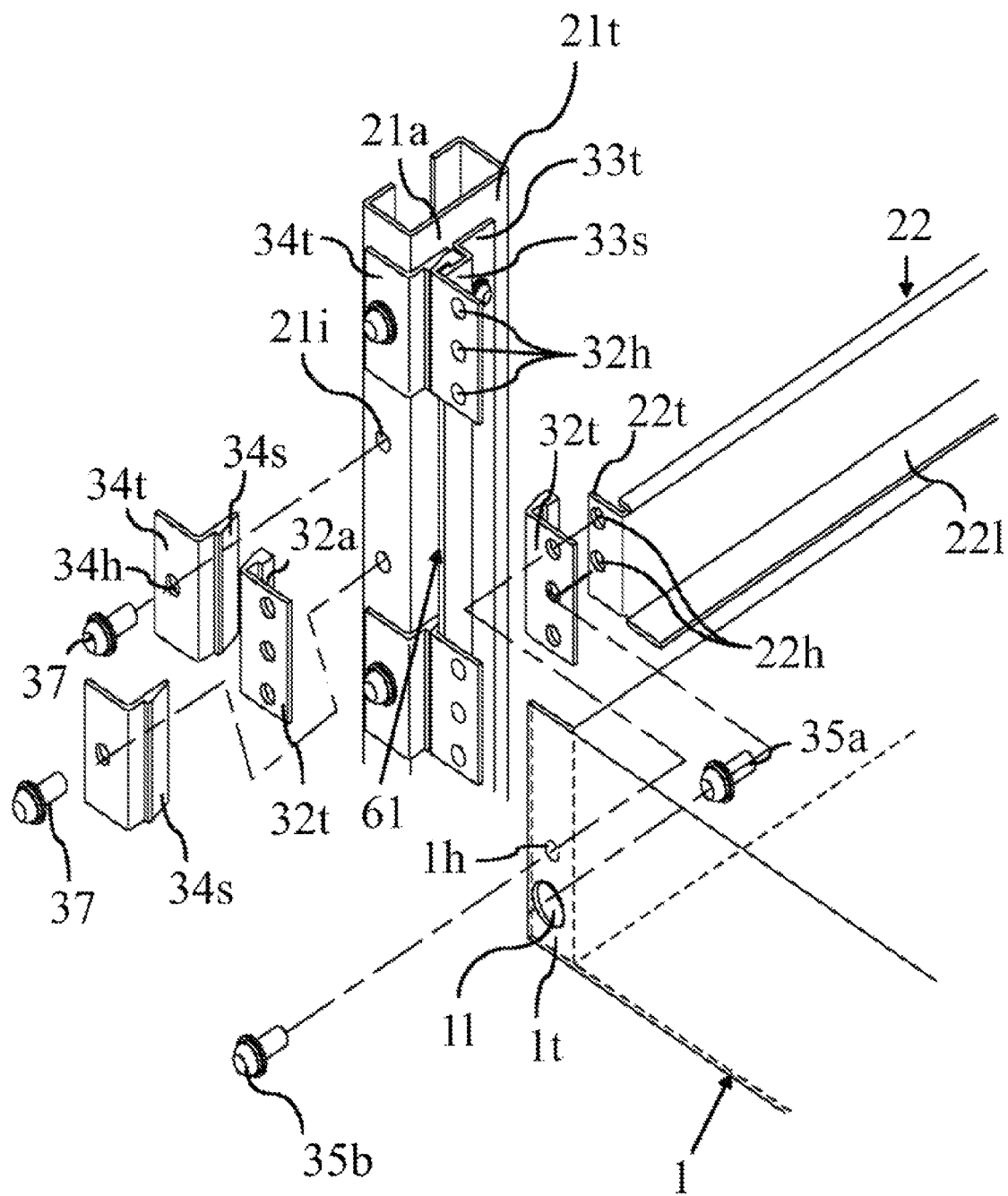
FIG. 4 is an exploded perspective view of the mounting structure of the cabinet rack.

FIG. 3 is an enlarged diagram illustrating part of a structure illustrated in FIG. 2. FIG. 4 is an exploded perspective view of the mounting structure of the cabinet rack. As illustrated in FIG. 3, each of the equipment mount support posts 33, which are included in first supporting members, has a structure in which a metal plate is bent so as to form a shape similar to a step in a flight of stairs. Each equipment mount support post 33 includes a fixing portion 33t and a guide 33u.

The guide 33u has an L-shape, one end of which is continuous with the fixing portion 33t. The guide 33u and the corresponding fixing portion 21t form an opening 61 (engaging space) therebetween. A guide groove 33m is formed on a surface of the guide 33u.

A second supporting member 32 includes a metal plate or a component formed of resin, which is made to have a substantial L-shape and a length equal to or slightly smaller than that of a mounting unit (1 U=44.45 mm). The second supporting member 32 in the present embodiment is made to have a length of 44 mm. The second supporting member 32 includes a screw fastening portion 32t having tapped holes, and a slider portion 32s. The slider portion 32s includes a protrusion 32a to be engaged with the guide groove 33m on one side thereof, and an inclined surface 32b on the opposite side.

As illustrated in FIG. 3, a thick portion of the second supporting member 32 (the protrusion 32a of the slider portion 32s) is formed so as to have a width smaller than that of the opening 61 in order to allow the second supporting member 32 to be removably inserted. As illustrated in FIG. 3, the guide groove 33m is formed to have a width slightly wider than that of the protrusion 32a that is upwardly and downwardly slidable in the guide groove 33m. Since the length of the second supporting member 32 is substantially identical to that of the mounting unit, the number of usable second supporting members 32 corresponds to the number of pieces of electronic equipment (maximum unit number) mountable in the rack 20.

A third supporting member 34 includes a metal plate or a component formed of resin, which is made to have a substantial L-shape and a length equal to or slightly smaller than that of the mounting unit and includes a fastening portion 34t and a pressing portion 34s. The third supporting member 34 in the present embodiment is made to have a length of 44 mm. The fastening portion 34t and a corresponding fixing portion 21a of the rack support post 21 oppose each other at a tapped hole 34h and a corresponding tapped hole 21i and are secured to each other with a screw 37.

As described in FIG. 4, the pressing portion 34s includes an inclined surface 34b that opposes and overlaps the inclined surface 32b of the corresponding second supporting member 32. In other words, the inclined surface 32b and the inclined surface 34b are made so as to have identical angles of inclination in opposite directions in a front-back direction of the casing, or, an insertion-removal direction. The angles of inclination are determined with consideration of an engaging condition of the inclined surface 32b and the inclined surface 34b.

In detail, as illustrated in FIG. 3, by fastening the screw 37, the pressing portion 34s of the third supporting member 34 is inserted in the direction denoted by A into the opening 61 along the inclined surface 32b. With the insertion of the third supporting member 34 into the opening 61, the inclined surface 34b presses the inclined surface 32b in the direction denoted by B in the opening 61. Therefore, when the screw 37 is fastened, the protrusion 32a is pressed against the guide groove 33m. In other words, the second supporting member 32 is secured by squeezing the pressing portion 34s and the slider portion 32s without a gap therebetween in the engaging space formed between the corresponding rack support post 21 and the equipment mount support post 33.

When the screw 37 is loosened by being rotated in a direction opposite to the fastening direction, the pressing portion 34s slides toward outside the opening 61 along the inclined surface 32b. Thus, engagement of the pressing portion 34s with the slider portion 32s is released, and the second supporting member 32 is released. With the above-described structure, the piece of electronic equipment 1 is secured using a wedge effect where the first to third supporting members included in the rack-mount holder are engaged with each other.

The pressing portion 34s may alternatively be formed of an elastic material such as a plate spring, rubber, or resin. When an elastically deformable material such as rubber or resin is used, the fastening portion 34t may be omitted. In such a case, a pressing portion component formed of such a material is pushed into the opening 61 where the slider portion 32s is disposed by utilizing elastic deformation of the material. By doing this, the second supporting member 32 is secured.

Referring to FIG. 4, the piece of electronic equipment 1 includes fixing portions 1t. Each fixing portion it includes a tapped hole 1h and a relief hole 1l. The relief hole 1l is formed to have a size sufficient to allow the head of a screw 35a to pass therethrough. As described above, each second supporting member 32 is secured in place using the pressure caused by the corresponding third supporting member 34.

The fastening portion 32t of the second supporting member 32 and a fixing portion 22t of the mounting support 22 are positioned in such a manner that tapped holes 32h and tapped holes 22h oppose each other, and are secured to each other with the screw 35a. After that, the piece of electronic equipment 1 is mounted on the mounting surfaces 22l that extend from the mounting supports 22.

Each fixing portion it of the piece of electronic equipment 1, the fastening portion 32t of the corresponding second supporting member 32, and the fixing portion 22t of the corresponding mounting support 22 are positioned so as to cause the corresponding tapped holes 1h, 32h, and 22h to oppose each other, and are fastened with a screw 35b. In so doing, the head of the screw 35a used to fasten the mounting support 22 protrudes from the relief hole 1l.

Figure 5:
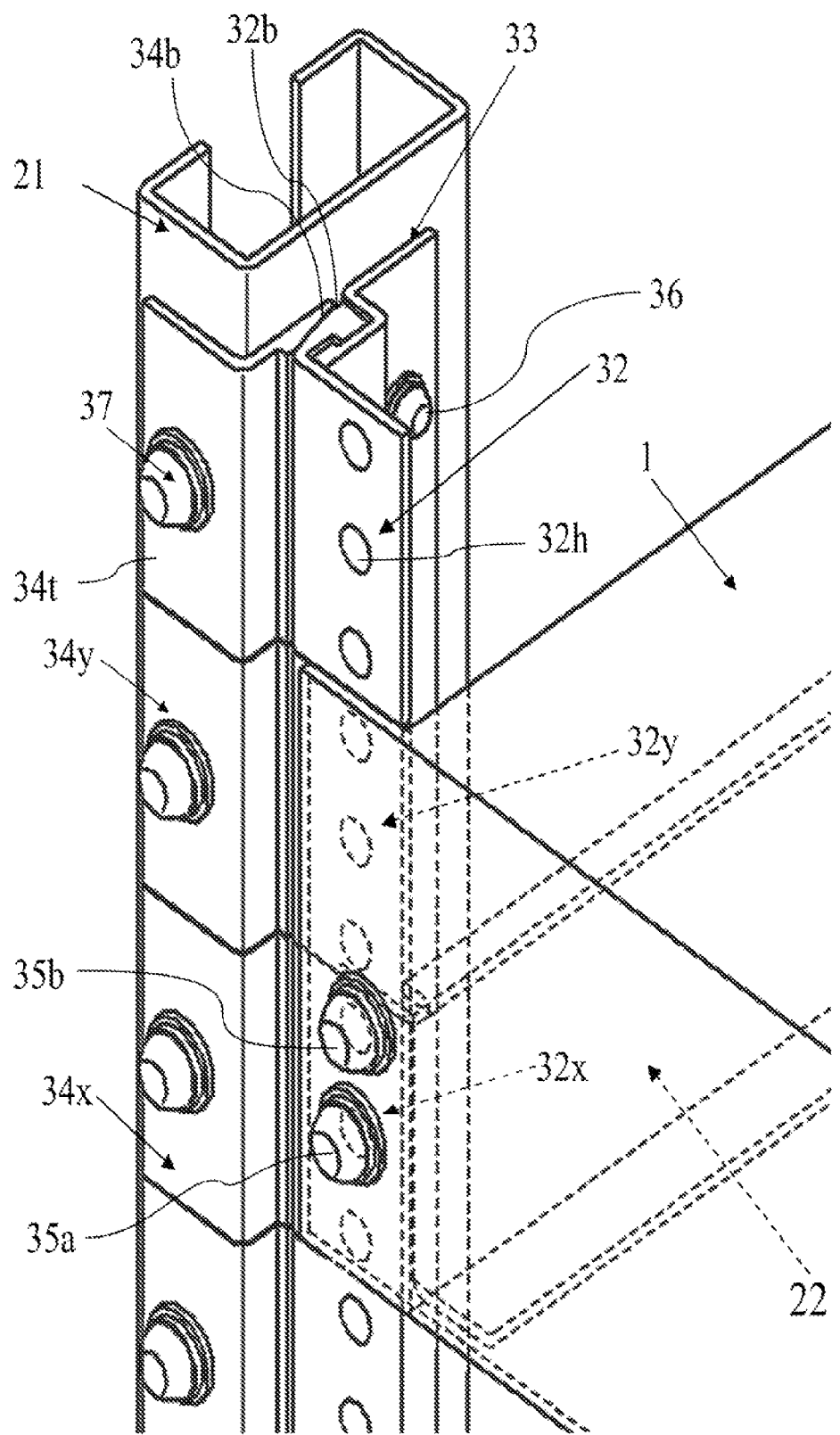
FIG. 5 illustrates a mounted state of a piece of electronic equipment.

FIG. 5 illustrates a mounted state of the piece of electronic equipment 1. The third supporting members 34 are secured to the rack support post 21 with the screws 37. In the present embodiment, the height of the example piece of electronic equipment 1 is 2 U. In such a case, the piece of electronic equipment 1 occupies a space corresponding to two of the third supporting members 34x and 34y.

Therefore, the third supporting member 34x, which is positioned below the piece of electronic equipment 1, and the corresponding second supporting member 32x are used to secure the piece of electronic equipment 1 by the method described above. Here, it is allowed to secure the third supporting member 34y and the corresponding second supporting member 32y to the corresponding rack support post 21 with the screw 37 as illustrated in FIG. 5, although they do not support the piece of electronic equipment 1. This prevents the second supporting members 32 and the third supporting members 34 from being lost and facilitates management of the components.

Figure 6A:
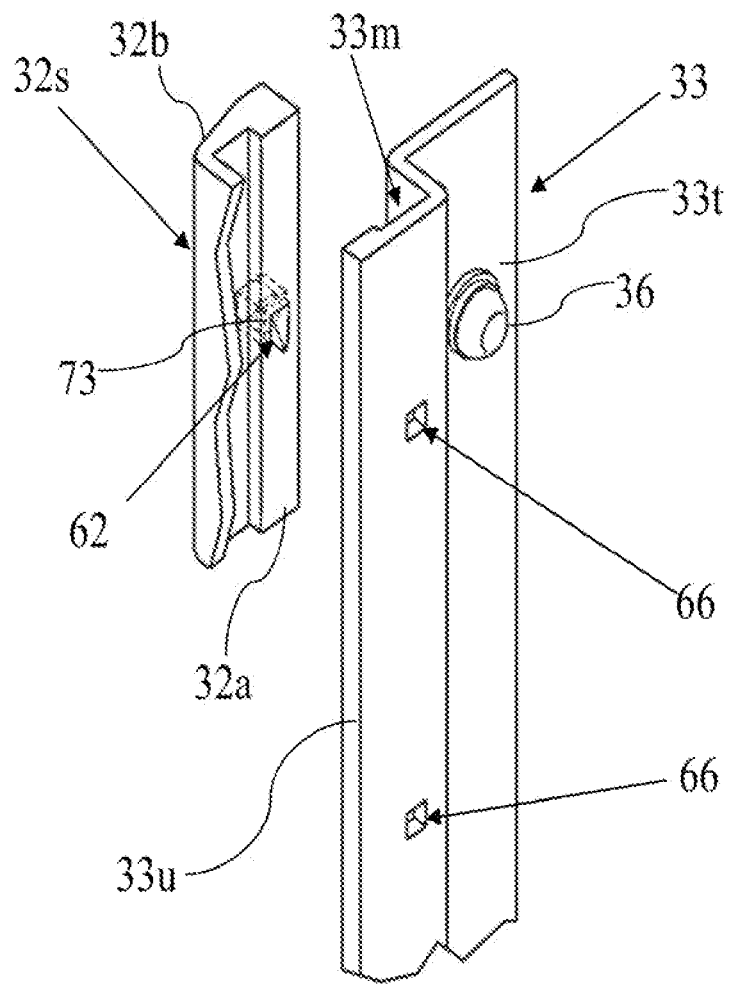
FIGS. 6A and 6B are schematic diagrams illustrating a structure of anti-drop member.
Figure 6B:
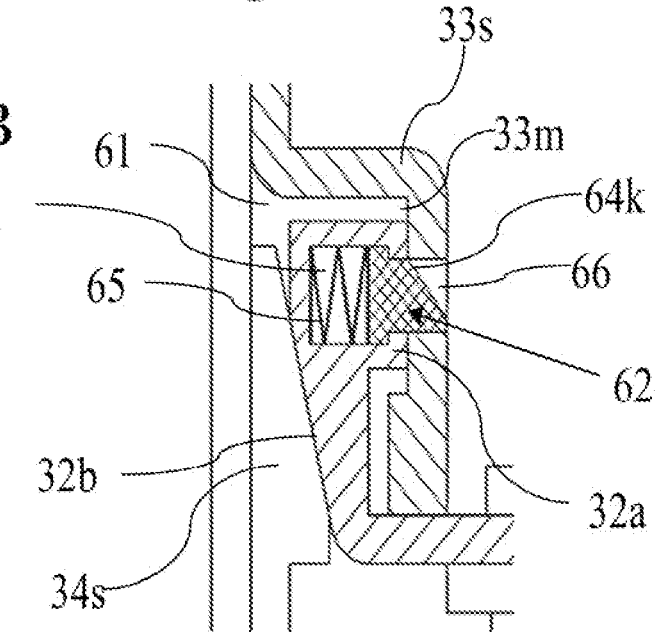

Next, an embodiment where an anti-drop mechanism is provided in the first supporting member and the second supporting member 32 will be described. FIGS. 6A and 6B are schematic diagrams illustrating a structure of an anti-drop member 62. FIG. 6A is a perspective view and FIG. 6B is a cross sectional view of the anti-drop member 62.

As illustrated in FIGS. 6A and 6B, the protrusion 32a of the second supporting member 32 has a hole 63 formed therein to receive the anti-drop member 62. A window 73 is formed in the hole 63. The anti-drop member 62 includes a stopper 64 and a coil spring 65 disposed inside the hole 63. The coil spring 65 may alternatively be formed of an elastic material such as a plate spring, rubber, or resin.

As illustrated in FIG. 6B, the stopper 64 is pressed out of the window 73 owing to an elastic force of the coil spring 65 and enters a slit 66 of the equipment mount support post 33. Therefore, entering of the stopper 64 into the slit 66 prevents the piece of electronic equipment 1 from dropping.

As illustrated in FIG. 6B, a leading end of the stopper 64 forms an inclined surface 64k such that the stopper 64 widens from the top to the bottom. The bottom surface of the stopper 64 is disposed perpendicular to the bottom side of the slit 66. Therefore, the inclined surface 64k allows the second supporting member 32 to move upward in the rack 20. However, the second supporting member 32 is not allowed to move downward in the rack 20 since the bottom surface of the stopper 64 is caught by the bottom side of the slit 66. Thus, dropping of the piece of electronic equipment 1 with the second supporting members 32 mounted thereto is prevented while the piece of electronic equipment 1 is being moved.

When the piece of electronic equipment 1 is moved to a lower position in the rack 20, the above-described engagement (locking) of the stopper 64 of the anti-drop member 62 with the slit 66 may preferably be released. Therefore, a shutter 71 is used.

Figure 7A:
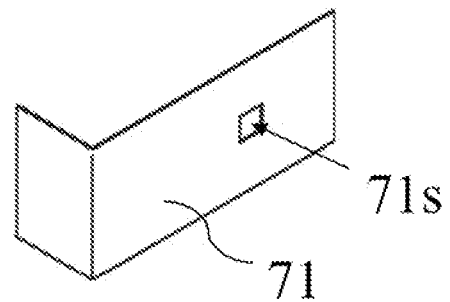
FIGS. 7A and 7B are schematic diagrams illustrating a configuration of a shutter.
Figure 7B:
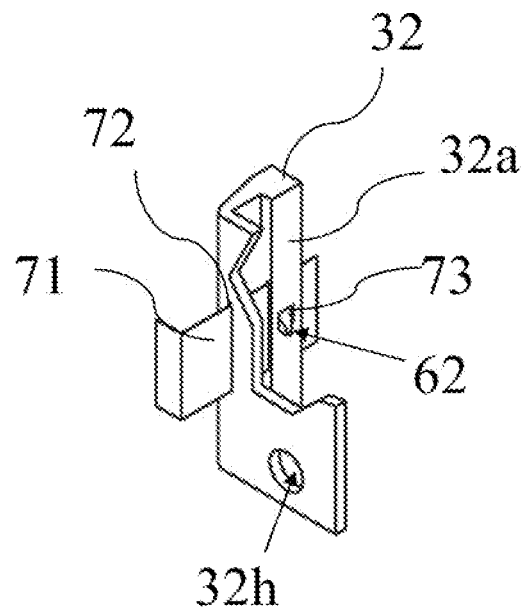

FIGS. 7A and 7B are schematic diagrams illustrating a configuration of the shutter mechanism. FIG. 7A illustrates a structure of the shutter 71. The L-shaped plate-like shutter 71 is formed of metal, resin, or the like. FIG. 7B illustrates how the shutter 71 is installed. The shutters 71 are slidably inserted along slits formed in the corresponding second supporting members 32.

As illustrated in FIG. 7A, each shutter 71 is formed to have an L-shape. Therefore, a bent portion of the shutter 71 is exposed at the front side and the back side of the piece of electronic equipment 1, thereby facilitating manually pushing and pulling the shutter 71 into and out of the second supporting member 32.

In the present embodiment, since the shutter 71 is provided in each second supporting member 32, there is no particular structure for the shutter 71. This facilitates management of the shutter 71. Alternatively, the shutter 71 may be not permanently provided in each second supporting member 32 in order to reduce the cost. For example, the shutters 71 for four positions (for one mounting space) are provided. The four shutters 71 may be respectively inserted into the four gaps between the slider portions 32s and the pressing portions 34s of a certain mounting space only when releasing of the stoppers 64 of that mounting space is desirable for a user.

Figure 8A:
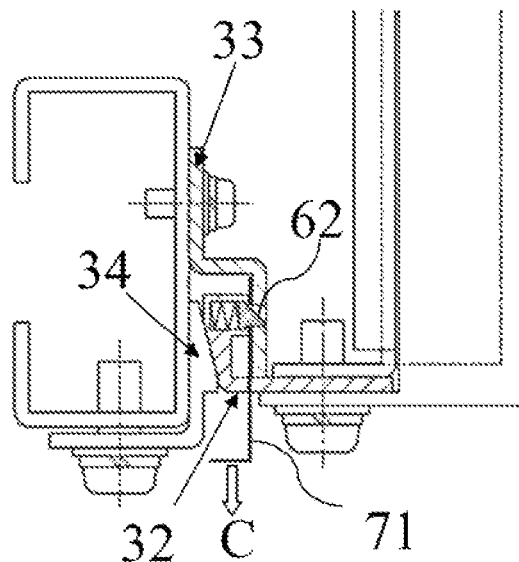
FIGS. 8A to 8D are diagrams illustrating an operation in which a stopper is released.
Figure 8B:
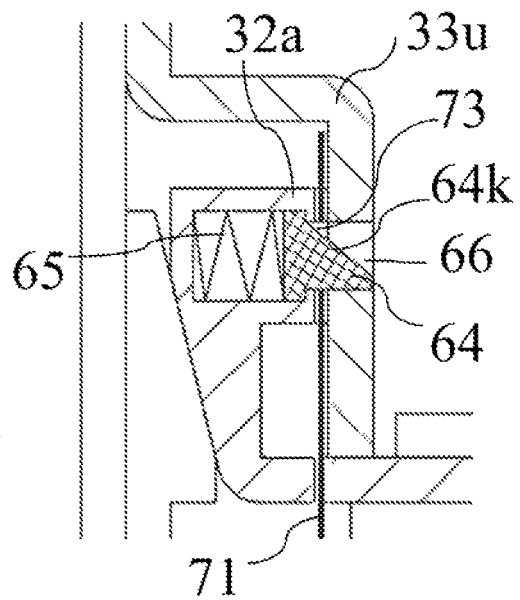

FIGS. 8A to 8D are diagrams illustrating an operation in which the stopper 64 is released. FIG. 8A illustrates a state where the stopper 64 is engaged with the slit 66 (locked state). FIG. 8B is an enlarged view of the state illustrated in FIG. 8A.

When the shutter 71 is pushed into the opening 61 and reaches a back portion of the opening 61, a slit 71s of the shutter 71 moves to a position where the slit 71s opposes the window 73 of the corresponding second supporting member 32 and the slit 66 of the corresponding equipment mount support post 33. In so doing, the stopper 64 is ejected owing to the elastic force of the coil spring 65. Thus, the anti-drop mechanism enters the locked state.

Figure 8C:
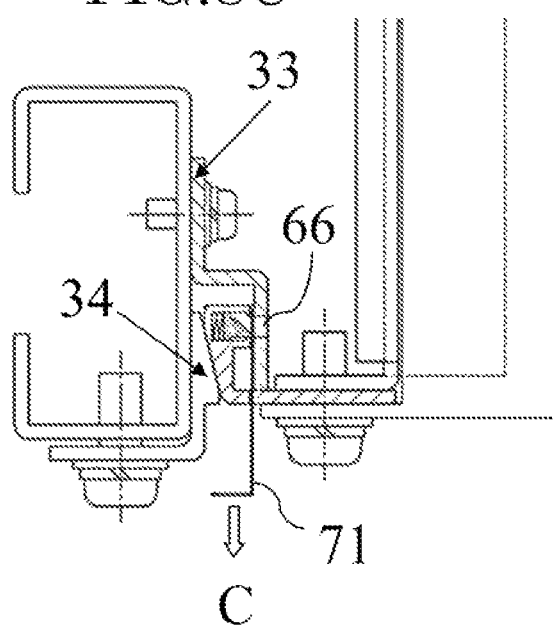
Figure 8D:
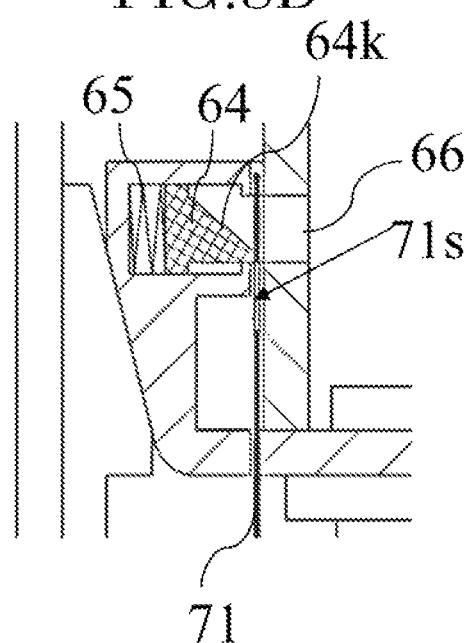
Figure 10:
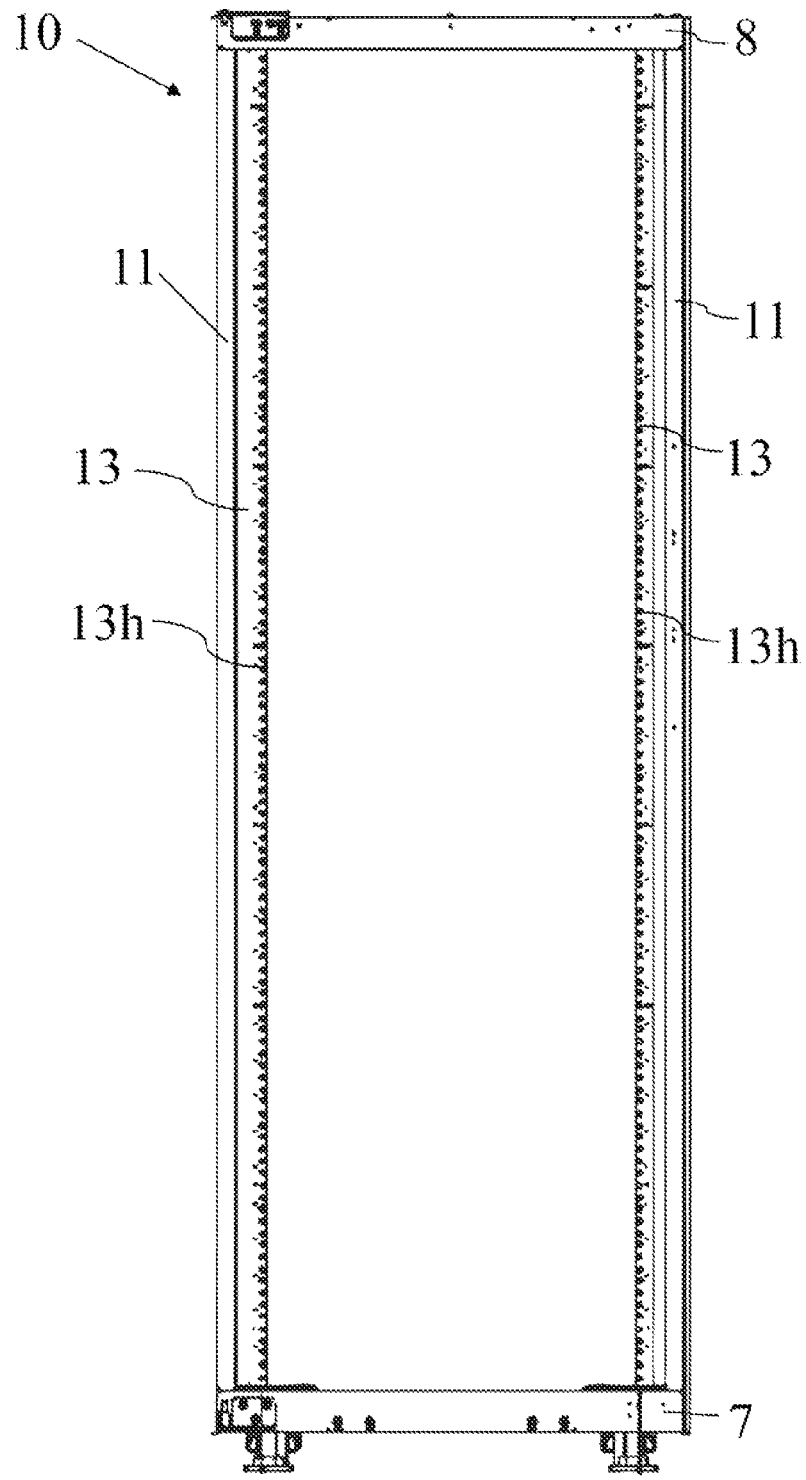
FIG. 10 is a schematic diagram illustrating an interior of a cabinet rack seen from a front side.
Figure 11:
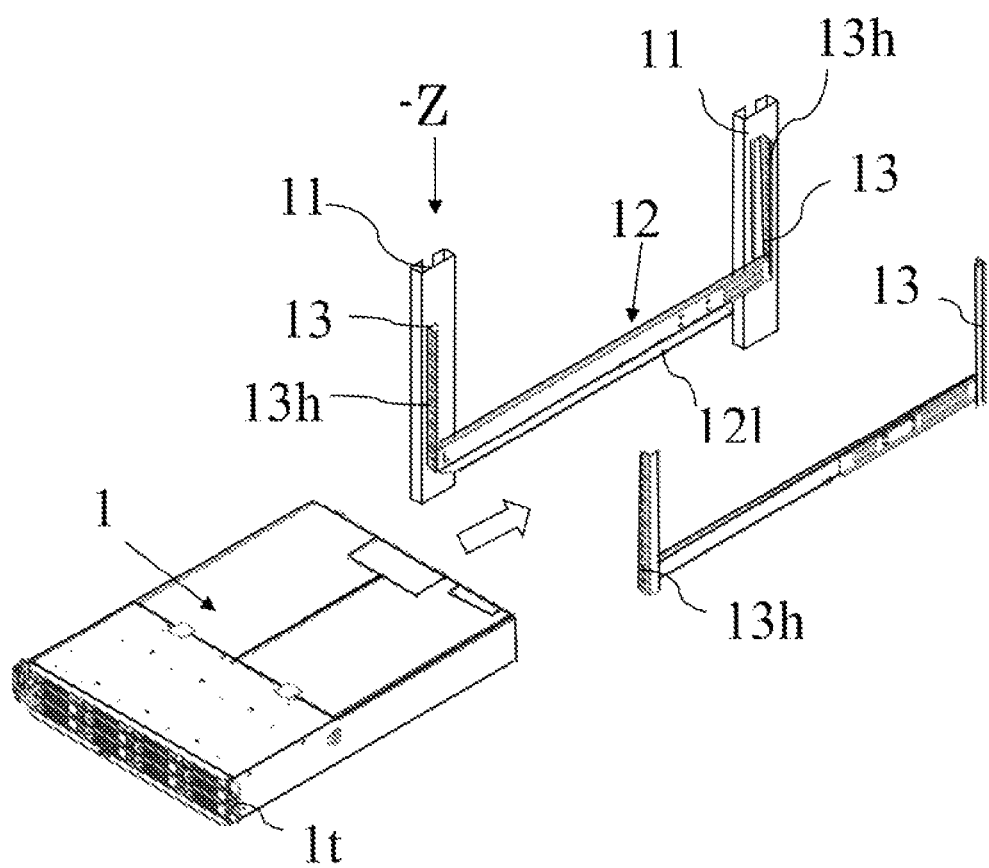
FIG. 11 illustrates an operation in which a piece of electronic equipment is mounted.
Figure 12:
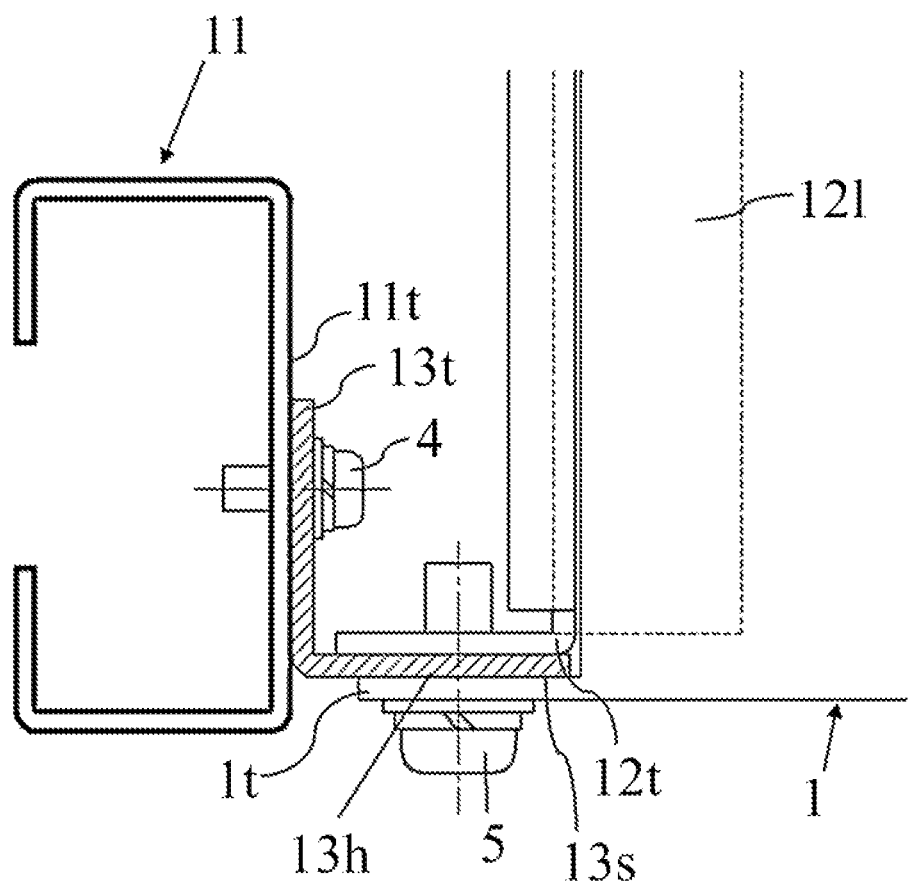
FIG. 12 illustrates a structure illustrated as seen in the −Z direction in FIG. 11.

FIG. 8C illustrates a state where engagement of the stopper 64 with the slit 66 is released (unlocked state). FIG. 8D is an enlarged view of the state illustrated in FIG. 8C.

When the shutter 71 is pulled out of the opening 61 in the direction denoted by C, the slit 71s of the shutter 71 moves to a position where the slit 71s does not oppose the window 73 and the slit 66, and the stopper 64 is pushed back into the hole 63. Therefore, the anti-drop mechanism enters the unlocked state. This allows the mounting supports 22 to which the piece of electronic equipment 1 are mounted to slide in the top-bottom direction.

FIGS. 9A to 9F illustrate a way to mount additional electronic equipment to the rack 20. As illustrated in FIG. 9A, in a preliminary stage (step 1), the second supporting members 32 and the third supporting members 34 are mounted in the fifth to ninth (counted in mounting units) mounting spaces that are not occupied by the pieces of electronic equipment. As described above, by securing the second supporting members 32 and third supporting members 34 to the rack support posts 21 in such unoccupied spaces, keeping of the unused second and third supporting members 32 and 34 is facilitated.

As illustrated in FIG. 9B, in step 2, the third supporting members 34 for the fifth mounting space are removed from the rack support posts 21 by loosening the corresponding screws 37. The second supporting members 32, which have been released from the pressing force for securing, are removed from the openings 61. This step is performed for each of the four rack support posts 21 as many times as the number of spaces for additional mounting.

In the description below, the present embodiment will be described for a case where one additional piece of equipment with a mounting height of 1 U (equal to one mounting space) is mounted.

As illustrated in FIG. 9C, in step 3, a piece of electronic equipment 44 positioned at the topmost location among the existing pieces of equipment is moved to a higher space in the rack 20. Initially, the screws 37 are removed in order to release the second supporting members 32 so as to cause the second supporting members 32 to move in the top-bottom direction. In so doing, each of the pieces of electronic equipment 42 to 44 is secured to the corresponding second supporting members 32. Therefore, the corresponding third supporting members 34 are removed with the screws 37. Then, all the second supporting members 32 are released. The second supporting members 32 are not removed from the piece of electronic equipment 44.

The piece of electronic equipment 44 is moved to a mounting space one space higher than the current mounting space in the rack. The above-described anti-drop member 62 is provided in each second supporting member 32. Owing to the leading end shape of the stopper 64 of the anti-drop member 62, a piece of electronic equipment is upwardly movable but is not downwardly movable in the rack 20. Therefore, the stopper 64 is utilized to loosely secure the piece of electronic equipment 44.

After the piece of electronic equipment 44 is loosely secured, the screws 37 are fastened at the third supporting members 34 at four positions in order to secure the corresponding second supporting members 32. Thus, the piece of electronic equipment 44 is secured in a mounting space that is one space higher than the original mounting space. Likewise, each of the pieces of electronic equipment 42 and 43 is upwardly moved in the rack by one mounting space.

FIG. 9D illustrates a state where the pieces of electronic equipment 42 to 44 have been moved in step 4. One mounting space for additional mounting is provided between the pieces of electronic equipment 41 and 42.

As illustrated in FIG. 9E, in step 5, the second supporting members 32 and the third supporting members 34 having been removed are inserted into the openings 61 of the second mounting space that has been an empty mounting space. As described above, by fastening the screws 37 of the third supporting members 34, the second supporting members 32 are secured.

The fixing portions 32t of the second supporting members 32 and the corresponding fixing portions 22t of the mounting supports 22 are aligned with each other and secured by the screws 35a. After that, an additional piece of electronic equipment 50 is mounted on the mounting surfaces 22l that extend from the mounting supports 22.

After that, as illustrated in FIG. 9F, in step 6, the tapped holes 1h of the additional piece of electronic equipment 50, the corresponding tapped holes 32h of the second supporting members 32, and the corresponding tapped holes 22h of the mounting supports 22 are caused to oppose each other and are secured by the screw 35b. The additional mounting work is finished by connecting cables and the like to the additional piece of electronic equipment 50.

This allows additional mounting work to be efficiently performed without stopping operations of the existing pieces of electronic equipment 42 to 44 or without removing these pieces of equipment from the rack 20. In addition, the existing pieces of electronic equipment are easily and safely moved in the rack 20. This allows the user to mount additional pieces of equipment at positions convenient for operations performed by the user.

The second supporting members 32 and the third supporting members 34 of the rack-mount holder are usable for pieces of electronic equipment of different heights when each of the second supporting members 32 and the third supporting members 34 are formed to be of a size that is at least greater than a screw fixing area where the tapped holes or hole for securing are provided and is smaller than or equal to the mounting unit (1 U=44.45 mm).

In particular, when the second supporting member 32 is formed so as to have a height of 44.45 mm−αmm (α≤2), positioning in stacking standard-size pieces of electronic equipment is facilitated. The third supporting member 34 may be formed so as to have a height greater than or equal to 44.45 mm since the larger the pressing portion 34s that presses and secures the second supporting member 32 is, the stronger the pressing force becomes.

In addition, as described above, the present embodiment includes the anti-drop mechanism. This allows the electrical equipment to be moved without being dropped while it is moved in the rack 20, and allows the electrical equipment to be positioned in a desired position in the rack 20. Therefore, additional mounting of the electronic equipment is safely and efficiently performed.

A cabinet rack and a rack-mount holder that are disclosed herein allow additional mounting of electronic equipment to be safely and efficiently performed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cabinet rack for housing a plurality of pieces of electronic equipment, the pieces of electronic equipment each secured to a mounting member, the cabinet rack comprising:
   a plurality of vertically extending support posts;
   a first supporting member secured to one of the support posts, the first supporting member including a guide vertically extending along the one of the support posts so as to allow the pieces of electronic equipment to be mounted, the guide with the one of the support posts forming a guide groove therebetween;
   a second supporting member including a fixing portion for fixing the mounting member, and a slider portion provided in the guide groove so as to allow one of the pieces of electronic equipment to vertically slide along the guide from one mounting position to another mounting position in the cabinet rack; and
   a third supporting member including a pressing portion provided between the slider portion and the one of the support posts to secure the second supporting member to the first supporting member by pressing the slider portion against the guide, wherein,
     the third supporting member includes a fastening portion for fastening the third supporting member to the one of the support posts with a screw,
     the pressing portion presses the slider portion against the guide so as to cause the pressing portion and the slider portion to be engaged with each other in the guide groove when the fastening portion is fastened to the one of the support posts by tightening the screw, and
     the pressing portion of the third supporting member and the slider portion of the second supporting member have inclined surfaces so as to face each other, and the inclined surface of the pressing portion slides along the inclined surface of the slider portion when the screw in the third supporting member is tightened or loosened.

2. The cabinet rack according to claim 1, wherein the second supporting member further includes an anti-drop stopper movable in a horizontal direction, and the first supporting member has a slit formed at a position opposite the anti-drop stopper so as to cause the anti-drop stopper to be engaged with the slit.

3. The cabinet rack according to claim 2, further comprising:
   a shutter to release the engagement of the anti-drop stopper with the slit, the shutter being provided between the first supporting member and the second supporting member.

4. A rack mount holder for securing a mounting member to one of vertically extending support posts in a cabinet rack that houses a plurality of pieces of electronic equipment, the pieces of electronic equipment each secured to the mounting member, the rack mount holder comprising:
   a first supporting member secured to one of the support posts, the first supporting member including a guide vertically extending along the one of the support posts so as to allow the pieces of electronic equipment to be mounted, the guide with the one of the support posts forming a guide groove therebetween;
   a second supporting member including a fixing portion for fixing the mounting member, and a slider portion provided in the guide groove so as to allow one of the pieces of electronic equipment to vertically slide along the guide from one mounting position to another mounting position in the cabinet rack; and
   a third supporting member including a pressing portion provided between the slider portion and the one of the support posts to secure the second supporting member to the first supporting member by pressing the slider portion against the guide, wherein,
     the third supporting member further includes a fastening portion for fastening the third supporting member to the one of the support posts with a screw,
     the pressing portion presses the slider portion against the guide so as to cause the pressing portion and the slider portion to be engaged with each other in the guide groove when the fastening portion is fastened to the one of the support posts by tightening the screw, and
     the pressing portion of the third supporting member and the slider portion of the second supporting member have inclined surfaces so as to face each other, and the inclined surface of the pressing portion slides along the inclined surface of the slider portion when the screw of the fastening portion in the third supporting member is tightened or loosened.

5. The rack mount holder according to claim 4, wherein the second supporting member further includes an anti-drop stopper movable in a horizontal direction, and the first supporting member has a slit formed at a position opposite the anti-drop stopper so as to cause the anti-drop stopper to be engaged with the slit.

6. The rack mount holder according to claim 5, further comprising: a shutter to release the engagement of the anti-drop stopper with the slit, the shutter being provided between the first supporting member and the second supporting member.

7. A cabinet rack for housing a plurality of pieces of electronic equipment, the pieces of electronic equipment each secured to a mounting member, the cabinet rack comprising:
   a plurality of vertically extending support posts;

a first supporting member secured to one of the support posts, the first supporting member including a guide vertically extending along the one of the support posts so as to allow the pieces of electronic equipment to be mounted, the guide with the one of the support posts forming a guide groove therebetween;

a second supporting member including a fixing portion for fixing the mounting member, and a slider portion provided in the guide groove so as to allow one of the pieces of electronic equipment to vertically slide along the guide from one mounting position to another mounting position in the cabinet rack, wherein the second supporting member further includes an anti-drop stopper movable in a horizontal direction, and the first supporting member has a slit formed at a position opposite the anti-drop stopper so as to cause the anti-drop stopper to be engaged with the slit;

a third supporting member including a pressing portion provided between the slider portion and the one of the support posts to secure the second supporting member to the first supporting member by pressing the slider portion against the guide; and a shutter to release the engagement of the anti-drop stopper with the slit, the shutter being provided between the first supporting member and the second supporting member.

8. A rack mount holder for securing a mounting member to one of vertically extending support posts in a cabinet rack that houses a plurality of pieces of electronic equipment, the pieces of electronic equipment each secured to the mounting member, the rack mount holder comprising:

a first supporting member secured to one of the support posts, the first supporting member including a guide vertically extending along the one of the support posts so as to allow the pieces of electronic equipment to be mounted, the guide with the one of the support posts forming a guide groove therebetween;

a second supporting member including a fixing portion for fixing the mounting member, and a slider portion provided in the guide groove so as to allow one of the pieces of electronic equipment to vertically slide along the guide from one mounting position to another mounting position in the cabinet rack, wherein the second supporting member further includes an anti-drop stopper movable in a horizontal direction, and the first supporting member has a slit formed at a position opposite the anti-drop stopper so as to cause the anti-drop stopper to be engaged with the slit;

a third supporting member including a pressing portion provided between the slider portion and the one of the support posts to secure the second supporting member to the first supporting member by pressing the slider portion against the guide; and a shutter to release the engagement of the anti-drop stopper with the slit, the shutter being provided between the first supporting member and the second supporting member.

* * * * *